(12) United States Patent
Krishna et al.

(10) Patent No.: US 8,071,945 B2
(45) Date of Patent: Dec. 6, 2011

(54) INFRARED RETINA

(75) Inventors: Sanjay Krishna, Albuquerque, NM (US); Majeed M. Hayat, Albuquerque, NM (US); J. Scott Tyo, Tucson, AZ (US); Woo-Yong Jang, Albuquerque, NM (US)

(73) Assignees: STC.UNM, Albuquerque, NM (US); Arizona Board of Regents on behalf of the University of Arizona, Tucson, AZ (US)

( * ) Notice: Subject to any disclaimer, the term of this patent is extended or adjusted under 35 U.S.C. 154(b) by 127 days.

(21) Appl. No.: 12/184,491

(22) Filed: Aug. 1, 2008

(65) Prior Publication Data
US 2009/0072144 A1 Mar. 19, 2009

Related U.S. Application Data

(60) Provisional application No. 60/962,852, filed on Aug. 1, 2007.

(51) Int. Cl.
*G01J 5/20* (2006.01)
(52) U.S. Cl. .................................................. 250/338.4
(58) Field of Classification Search ................ 250/338.4, 250/332, 339.01
See application file for complete search history.

(56) References Cited

U.S. PATENT DOCUMENTS

| | | | |
|---|---|---|---|
| 2004/0256612 A1* | 12/2004 | Mohseni et al. | 257/14 |
| 2005/0211873 A1* | 9/2005 | Krishna et al. | 250/206 |
| 2005/0211996 A1* | 9/2005 | Krishna et al. | 257/85 |
| 2006/0054880 A1* | 3/2006 | Krishna et al. | 257/14 |

* cited by examiner

*Primary Examiner* — David Porta
*Assistant Examiner* — Marcus Taningco
(74) *Attorney, Agent, or Firm* — MH2 Technology Law Group LLP

(57) ABSTRACT

Exemplary embodiments provide an infrared (IR) retinal system and method for making and using the IR retinal system. The IR retinal system can include adaptive sensor elements, whose properties including, e.g., spectral response, signal-to-noise ratio, polarization, or amplitude can be tailored at pixel level by changing the applied bias voltage across the detector. "Color" imagery can be obtained from the IR retinal system by using a single focal plane array. The IR sensor elements can be spectrally, spatially and temporally adaptive using quantum-confined transitions in nanoscale quantum dots. The IR sensor elements can be used as building blocks of an infrared retina, similar to cones of human retina, and can be designed to work in the long-wave infrared portion of the electromagnetic spectrum ranging from about 8 μm to about 12 μm as well as the mid-wave portion ranging from about 3 μm to about 5 μm.

22 Claims, 6 Drawing Sheets

US 8,071,945 B2

INFRARED RETINA

RELATED APPLICATIONS

This application claims priority from U.S. Provisional Patent Application Ser. No. 60/962,852, filed Aug. 1, 2007, which is hereby incorporated by reference in its entirety.

GOVERNMENT RIGHTS

This invention was made with government support under Grant Nos. ECS-0401154 and IIS-0434102 awarded by the National Science Foundation, and Grant No. DE-AC52-06NA25396 awarded by the Department of Energy/National Nuclear Security Administration. The government has certain rights in the invention.

FIELD OF THE INVENTION

This invention relates generally to an infrared (IR) retinal system and a photodetector, and, more particularly, to infrared color based sensing of the photodetector for the IR retinal system.

BACKGROUND OF THE INVENTION

Spectral imagery has emerged in the past decade as one of the most powerful tools for a range of remote sensing problems including defeating camouflage, remote identification of chemical and biological compounds, and anomaly detection. Spectral imagery can take on many forms. For example, two-color infrared spectral imagery is useful for applications such as locating recently disturbed earth. In another example, multi-spectral imagery (MSI) are designed to have a small number (e.g., 3-15) of spectrally distinct bands in the visible, near infrared (IR), and mid IR range and with minimal overlap in their spectral responses. Some MSI systems utilize spatially separate focal plane arrays (FPAs) to measure each spectral band, which leads to increased system cost and results in large data volumes that make storage and transmission of data challenging in real time.

Other than near IR and mid IR portions, the long-wave-IR (LWIR) portion of spectrum has also been the focus of specific efforts, because objects near room temperature tend to be emissive rather than reflective in this wavelength range. This allows thermal imaging to be largely independent of illumination conditions, which may cause all the IR imaging "black and white" with no spectral content.

The human eye is a sensor that can elegantly represent a dynamic scene by extracting enormous visual information. The human eye uses a paradigm where the foveous of the eye is populated by three classes of cones, often referred to as the long—(L), middle—(M), and short—(S) wavelength sensitive cones. Unlike typical MSI bands, the L, M, and S cones have spectral responses with extremely high correlations ($\rho_{LM}$=0.91, $\rho_{LS}$=0.097, $\rho_{MS}$=0.18, where $\rho$ is the correlation coefficient). The eye compensates for this redundancy by initially decorrelating the responses of the individual receptors through weighted combinations of the receptor outputs. A consequence of this processing is that the relative importance of the combination channels are not equal, with the vast majority of the information being transmitted in the achromatic channel, and much less in the two chromatic channels with one including a red-green difference and the other including a blue-yellow difference.

Thus, there is a need to overcome these and other problems of the prior art and to provide a retinal system that operates in long-wave IR region similarly to the human eye operating in the visible spectral range and brings "color" to the IR range.

SUMMARY OF THE INVENTION

According to various embodiments, the present teachings include an infrared (IR) retinal system that includes a single focal plane array (FPA). The single FPA can further include a plurality of photodetectors with each photodetector having a spectral response that can be individually controlled. For example, the photodetctor can include one or more stacks of a heterostructure, where a plurality of quantum dots can be assembled in one or more quantum wells for providing a quantum confined Stark effect. In this manner, all related spectral information from the photodetectors can be encoded in individual pixel(s) of the single FPA, in spirit, similarly to the color coding in the cones of the human retina.

According to various embodiments, the present teachings also include a method for infrared sensing. In the method, a plurality of DWELL detectors can be formed in a single focal plane array (FPA). Each detector can include one or more stacks of a heterostructure having a plurality of quantum dots assembled in one or more quantum wells (i.e., DWELL) to provide a quantum confined Stark effect. Each DWELL detector can thus provide a controllable spectral response from which spectral information can be extracted using a signal processing algorithm.

According to various embodiments, the present teachings further include an IR retinal system. The IR retinal system can include a large area FPA that includes a plurality of DWELL detectors. Each DWELL detector can include a second n-doped layer disposed over a DWELL active structure and the DWELL active structure can be disposed over a first n-doped layer over a group III-V substrate. Specifically, the first and the second doped layers can include an alloy material made from, e.g., GaAs and/or AlAs. The DWELL active structure can include one or more stacks of a heterostructure including a plurality of quantum dots assembled in one or more quantum wells for providing a quantum confined Stark effect. Each quantum dot can further include an InAs and each quantum well can further include an In-containing composition having the element In of about 35% or less by weight.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1A:
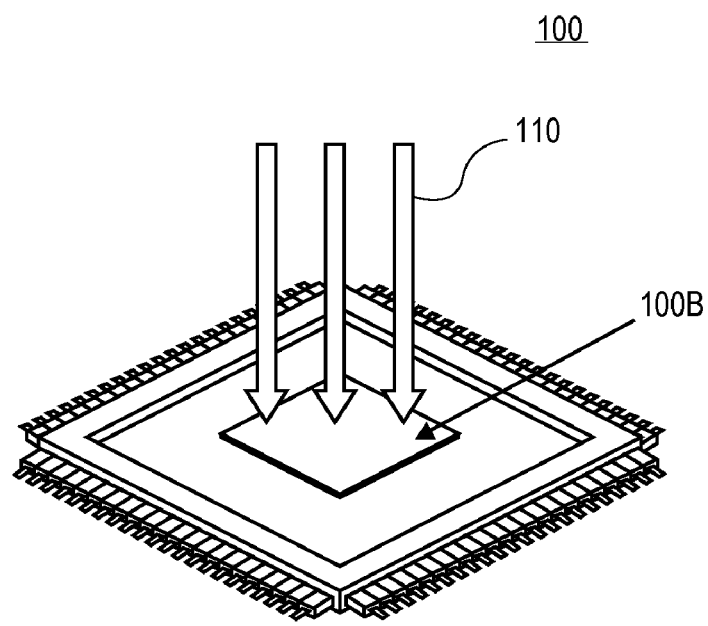
FIGS. 1A-1B depict an exemplary infrared (IR) retina system in accordance with the present teachings.

Reference will now be made in detail to exemplary embodiments of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values In this case, the example value of range stated as "less than 10" can assume values as defined earlier plus negative values, e.g. −1, −1.2, −1.89, −2, −2.5, −3, −10, −20, −30, etc.

Exemplary embodiments provide an infrared (IR) retinal system and method for making and using the IR retinal system. The IR retinal system can include one or more adaptive sensor elements, whose properties including, e.g., spectral response, signal-to-noise ratio, polarization, or amplitude can be tailored at pixel level by changing the applied bias voltage across the detector. "Color" imagery can be obtained from the IR retinal system by using a single focal plane array (FPA). The IR sensor elements can be spectrally, spatially and temporally adaptive using quantum-confined transitions in nanoscale quantum dots (QDs). The IR sensor elements can be used as building blocks of an infrared retina, similar to cones of human retina, and can be designed to work in the long-wave infrared (LWIR) portion of the electromagnetic spectrum ranging from about 8 µm to about 12 µm as well as the mid-wave portion ranging from about 3 µm to about 5 µm.

In one embodiment, the IR retina system can include sensor elements that include a self-assembled dots-in-a-well (DWELL) semiconductor structure. Information can then be sensed or detected based on intersubband transitions between quantum confined energy levels of the sensor elements. The sensor elements can sense information over different spectrally overlapping wavelength bands, with each spectral band corresponding to a distinct bias voltage applied to the photodetector, arisen as a result of quantum-confined Stark effect (QCSE) that changes the spectral response with the bias voltage across the detector system. For example, the shape of a spectral response can be a function of the applied bias voltage across the detector. In various embodiments, the overlapping bands can also be created to store other types of information, such as, polarization state of the incident field.

In various embodiments, an "algorithmic" spectrometer can then be established by sequentially providing different biases to the same device, which may be with different biases on the same device. For example, a signal processing algorithm can be employed to extract functional information including, e.g., color, amplitude or polarization state from a given set of bias-dependent responses or functional couplers in a process resembling the human eye in its functionality.

Figure 1B:
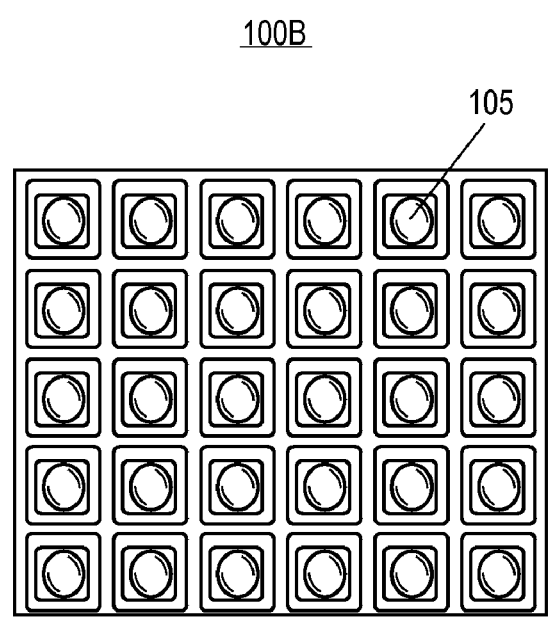

FIGS. 1A-1B depict an exemplary infrared (IR) retinal system 100 in accordance with the present teachings. Specifically, FIG. 1B depicts a portion of an exemplary IR retinal system 100 having a spatial array of IR pixels 105 with each pixel serving as a "spectrally agile cone" incorporated into a large area focal plane area (FPA) 100B. In various embodiments, the large area focal plane array (FPA) 100B can be formed including a desired number of pixels 105. For example, 320×256 FPA and 640×512 FPA imagers can be formed based on the DWELL technology described herein.

The IR pixels 105 can also be referred to herein as IR sensor elements, or DWELL detectors or photodetectors. Each single DWELL detector can provide different spectral information. The DWELL photodetector 105 can allow spectral information to be obtained in a single-detector's active area without the use of spectral or optical filters, gratings, or other optical components, although one of ordinary skill in the related art can understand that the filters, gratings or other optical components can also be used in some embodiments.

In various embodiments, the spectral response of each DWELL photodetector 105 can be individually controlled in an independent or dependent manner from one or more other DWELL photodetectors 105 of the single FPA 100B. In certain embodiments, the photodetector 105 can include a hyper or multicolor spectral response photodetector whose spectral response can be controlled individually in an independent or dependent manner from other hyper or multicolor spectral response photodetectors of the single FPA 100B.

Figure 1C:
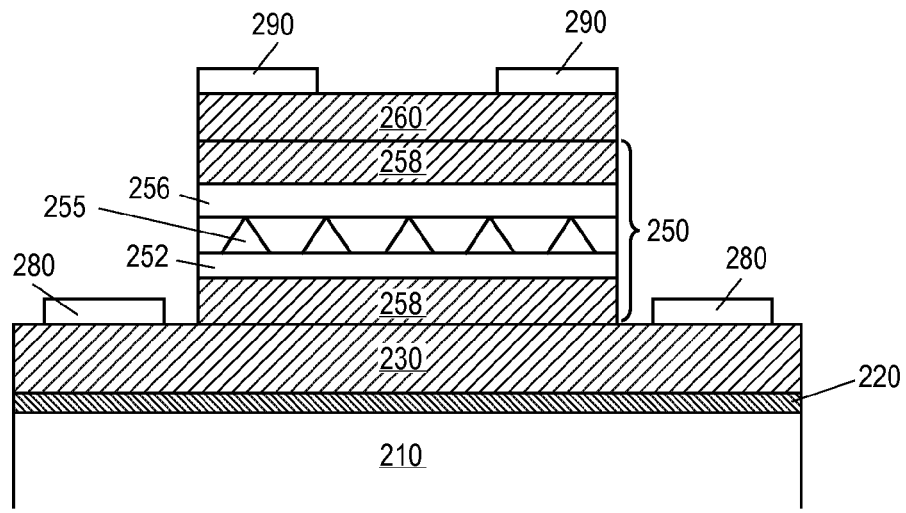
FIG. 1C depicts a portion of an exemplary dots-in-a-well (DWELL) detector used for the system of FIGS. 1A-1B in accordance with the present teachings.

The DWELL detector 105, i.e., the intersubband QD detector, can rely on transitions between quantum-confined energy levels in the quantum dots (QD) for the disclosed IR retinal system 100. FIG. 1C depicts an exemplary DWELL detector 105 in accordance with the present teachings.

In various embodiments, the DWELL detector/sensor (or IR pixel) 105 can be formed using a III-V compound semiconductor materials system. In these materials systems, examples of the group III element can include Ga, In or Al, while examples of the group V element can include As, Sb, N, or P. However, one of ordinary skill in the art can understand that many other different III-V semiconductor alloy compositions can be used, based on the known relationships between bandgap energy and lattice constant of different III-V compounds.

In the following description, III-V semiconductor alloy compositions can be described by the combination of III-V elements, such as, for example, InAs, GaAs, AlAs, InGaAs, GaN, AlGaN, AlInGaN, InGaAs, AlGaInAs, GaNAs, InGaAsP, or GaInNAs. Generally, the elements in a composition can be combined with various molar fractions. For example, the semiconductor alloy composition InGaAs can stand for $In_{(x)}Ga_{(1-x)}As$, where the molar fraction, x, can be any number less than 1.00. In an exemplary embodiment, the molar fraction x can be about 0.15 for the composition InGaAs, e.g., $In_{0.15}Ga_{0.85}As$, used for the DWELL detector 105.

The DWELL photodetector 105 can be formed using a variety of crystal growth techniques including, but not limited to, molecular-beam epitaxy (MBE), metal-organic chemical vapor deposition (MOCVD), gas source MBE (GSMBE), metal-organic MBE (MOMBE), atomic layer epitaxy (ALE), or organometallic vapor phase epitaxy (OMVPE). Other suitable semiconductor techniques can be used to form the detector 105. In an exemplary embodiment, the DWELL detector 105 can be grown at a temperature of about 400° C. to about 500° C.

The DWELL/pixel photodetectors 105 can include a bias tunable active region and, in some cases, can have one or more of spectral filters, spatio-spectral filters, gratings, photonic crystals, plasmon couplers formed thereon. In an exemplary embodiment, the DWELL/pixel detectors 105 can be fabricated including, e.g., standard contact-lithography, plasma-etching, and metallization techniques, for example, in a class 100 clean-room environment.

As shown in FIG. 1C, the DWELL photodetector 105 can include stacked hetero-layers including a substrate 210, a buffer layer 220, a first doped layer 230, a DWELL active structure 250, and a second doped layer 260. It should be readily obvious to one of ordinary skill in the art that the device 105 depicted in FIG. 1C represents a generalized schematic illustration and that other layers may be added or existing layers may be removed or modified.

The substrate 210 can be a semiconductor substrate formed of, for example, silicon, sapphire, silicon carbide, or any III-V compound semiconductor substrate including GaAs, InP or other similar material.

The buffer layer 220 can be formed over the substrate 210. For example, the buffer layer 220 can be an etch stop layer including AlAs for an exemplary GaAs-based semiconductor process.

The first doped layer 230 can be formed over the buffer layer 220 and can be formed of, for example, GaAs, or GaN. The first doped layer 230 can be made an n-type epilayer by doping with various impurities such as silicon, germanium, selenium, sulfur and tellurium. In various embodiments, the first doped layer 230 can be made a p-type layer by introducing beryllium, strontium, barium, zinc, or magnesium. Other dopants known to one of ordinary skill in the art can also be used.

The DWELL active structure 250 can be formed over the first doped layer 230. The DWELL active structure 250 can be formed including one or more heterostructure stacks. Each heterostructure can include a plurality of quantum dots 255 assembled in a plurality of quantum wells 252/256 for providing a quantum confined Stark effect (QCSE). For example, quantum dots (QDs) 255 can be grown in the quantum wells, wherein the quantum wells can in turned be formed in a matrix 258, such as a III-V matrix. The quantum dots 255 can be formed of, e.g., InAs or other III-V material and can be doped by silicon or other dopants known to one of ordinary skill in the art. The quantum wells (QWs) can be formed of, for example, an In-containing composition (e.g., InGaAs) having the element In of about 35% or less by weight. In an exemplary embodiment, the DWELL active structure 250 can include stacks of a heterostructure, for example, a number of stacks of InAs/GaAs/AlGaAs heterostructure.

In various embodiments, the shape of quantum dots 255 and the thickness of the quantum wells 252/256 can be important since the bias dependent response of the DWELL detector 105 depends on the asymmetry of the electronic potential that arises from two sources. For example, one source can be due to the shape of the dots. The shape of the QDs 255 can include, but is not limited to, hemisphere, triangle or rectangle. The other source can be due to the different thicknesses for the QW above and below the QDs 255, resulting in variation of the local potential as a function of the applied bias. In various embodiments, the QW layer 258 above the QDs 255 can have a thickness of about 1-10 nm and the QW layer 252 below the QDs 255 can have a thickness of about 1-10 nm. In an exemplary embodiment, operating wavelength of the DWELL detector can be controlled by controlling the thickness of the quantum wells. For example, by varying the thickness of the bottom quantum well (e.g., InGaAs) from about 10 Å to about 60 Å, the operating wavelength of the detector can be changed from 7.2 μm to 11 μm.

The second doped layer 260 can be formed over the DWELL active structure 250. The second doped layer 260 can be formed of, for example, GaAs. The second doped layer 260 can be doped with a conductivity type, an n-type or p-type, similar to the first doped layer 230.

Conductive structures/layers can also be used for the layered photodetector 105 illustrated in FIG. 1C. For example, bottom electrodes 280 and top electrodes 290 can be fabricated on surfaces of the first doped layer 230 and the second doped layer 260, respectively. Each of conductive structures can be formed from titanium (Ti), aluminum (Al), platinum (Pt), nickel (Ni) or gold (Au) in a number of multi-layered combinations such as Al/Ti/Pt/Au, Ni/Au, Ti/Al, Ti/Au, Ti/Al/Ti/Au, Ti/Al/Au, Al or Au. In various embodiments, the bottom electrodes 280 and top electrodes 290 can be used as ohmic contacts. In various embodiments, electrode contacts can be formed by, e.g., mesa etch techniques and metallization processes. In an exemplary embodiment, individual n-i-n mesas (e.g., a square having a square side of about 200-400 μm) can be lithographically defined, and the bottom and top contacts 280 and 290 can be deposited thereon.

Figure 2:
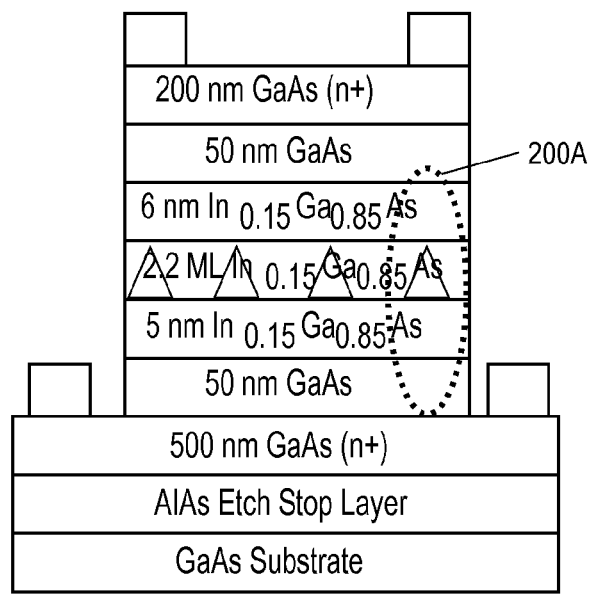
FIG. 2 depicts a certain embodiment of the DWELL detector of FIG. 1C in accordance with the present teachings.
Figure 2A:
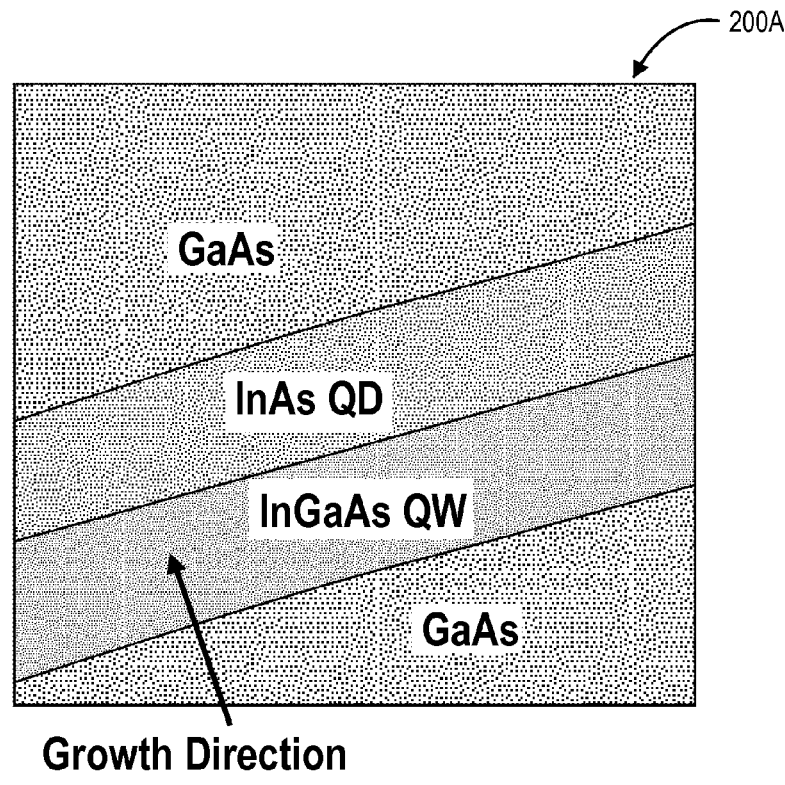
FIG. 2A depicts an exemplary image of the DWELL structure of FIG. 2 in accordance with the present teachings.

In various embodiments, the barrier layers (e.g., 220, 230, and 260) of the DWELL detector 105 can include any alloy made from GaAs and AlAs. FIG. 2 depicts a certain embodiment of the DWELL photodetector 105 of FIG. 1C in accordance with the present teachings. As shown, InAs QDs can be grown in an $In_{0.15}Ga_{0.85}As$ quantum well (QW), which in turn is positioned in a GaAs matrix. The DWELL detectors can be grown using molecular-beam epitaxy, e.g., with an $As_2$ cracker source. In the illustrated exemplary embodiment, an average of 2.2 monolayers (MLs) of InAs dots can be grown and can be Si-doped at a level of $1-5\times10^{10}/cm^2$. The DWELL detector 200 (also see 105 of FIG. 1C) can include, e.g., 30 stacks of InAs/GaAs/AlGaAs heterostructures (also see the structure 250 of FIG. 1C) between two n+-doped GaAs contact layers (also see the layer 230 and 260 of FIG. 1C). The illustrated embodiment of FIG. 2 further shows exemplary thickness of each layer for the DWELL detector. For example, the DWELL detector can have an n-doped 200-nm-thick GaAs layer formed over a DWELL active structure, which can be formed over another n-doped 500-nm-thick GaAs layer over a GaAs substrate. The DWELL active structure of the illustrated example of FIG. 2 can further include a 2.2-ML-thick InAs QDs disposed between a 6-nm thick and a 5-nm thick $In_{0.15}Ga_{0.85}As$ QW disposed in a GaAs matrix. High-resolution TEM images reveal that the QDs can be confined to the top half of the QW as indicated in FIG. 2A.

In various embodiments, the disclosed DWELL detectors 105 can represent a hybrid between conventional QW IR photodetectors and QD IR photodetectors. Unlike quantum well (QW) detectors, DWELL detectors can be sensitive to normal-incidence radiation (see 110 in FIG. 1A). Electrons in the ground state of the QDs can be promoted to a set of bound states within the QW by photoexcitation. The increased intersubband relaxation times in QDs can result in a significantly larger detectivity. Lower dark current levels can be predicted in QD detectors when the ground state is lowered with respect to the used semiconductor material (e.g., GaAs) band edge. Apart from lower dark currents, the DWELL active structure can demonstrate a large QCSE that can be exploited for the disclosed infrared retinal system. The DWELL design can also provide better control over the operating wavelength and nature of the transition (bound-to-bound versus bound-to-continuum). In addition, QD detectors can be operated at room temperature or higher temperatures due to the reduced thermionic emission.

For example, room-temperature photoluminescence measurements can yield a peak at $\lambda=1.22$-$1.24$ μm, which is attributed to the interband to ground state transition in the quantum dot of the DWELL detector 105. The wavelengths peaks that are longer than 5.5 μm can be attributed to a transition from the ground state in the QD to a bound state in the QW. In various embodiments, the DWELL detector can provide a wavelength peak ranging from about 3 μm to about 30 μm in the IR region. In various embodiments, spectral response measurements can be performed, e.g., on single pixel InGaAs-DWELL detectors with a FTIR spectrometer (e.g., Nicolet 870) and a current-amplifier (e.g., Keithley 428). Calibrated blackbody measurements can reveal that the specific detectivity, $D^*$, obtained from a 15 stack DWELL detector is $7\times10^{10}$ $cmHz^{1/2}/W$ at 77K.

Figure 2B:
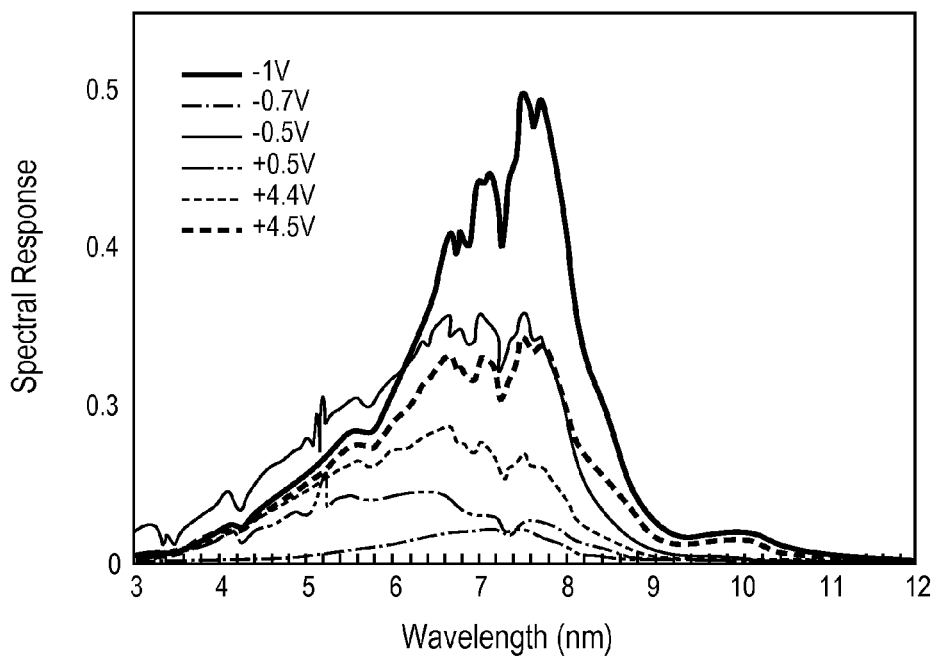
FIG. 2B depicts exemplary spectral responses of an exemplary IR retinal system in accordance with the present teachings.

FIG. 2B depicts spectral responses of the exemplary IR retinal system in accordance with the present teachings. As shown, the spectral responses of the exemplary IR retinal system can vary continuously and in a highly correlated fashion. In various embodiments, the spectral response can be exploited in an array format with either fixed spatial functionality, as is done in the retina, or dynamic spatiotemporal functionality.

Figure 3A:
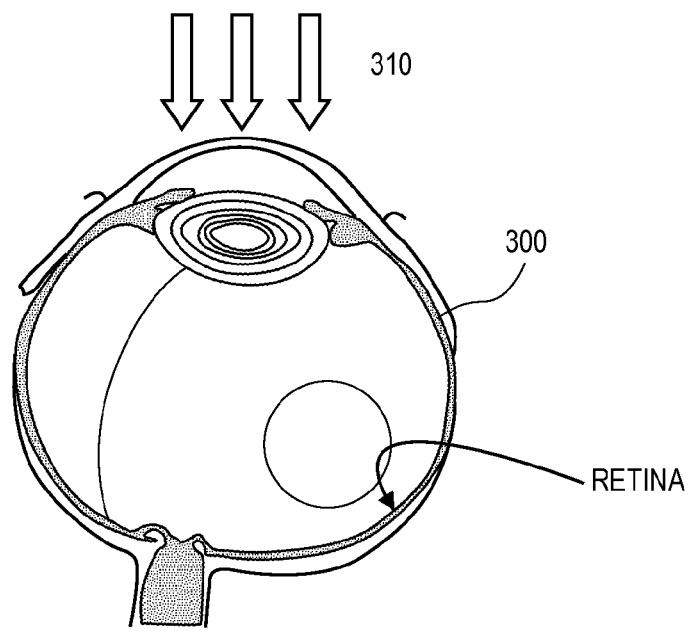
FIGS. 3A-3B depict working mechanism of human eye retina.
Figure 3B:
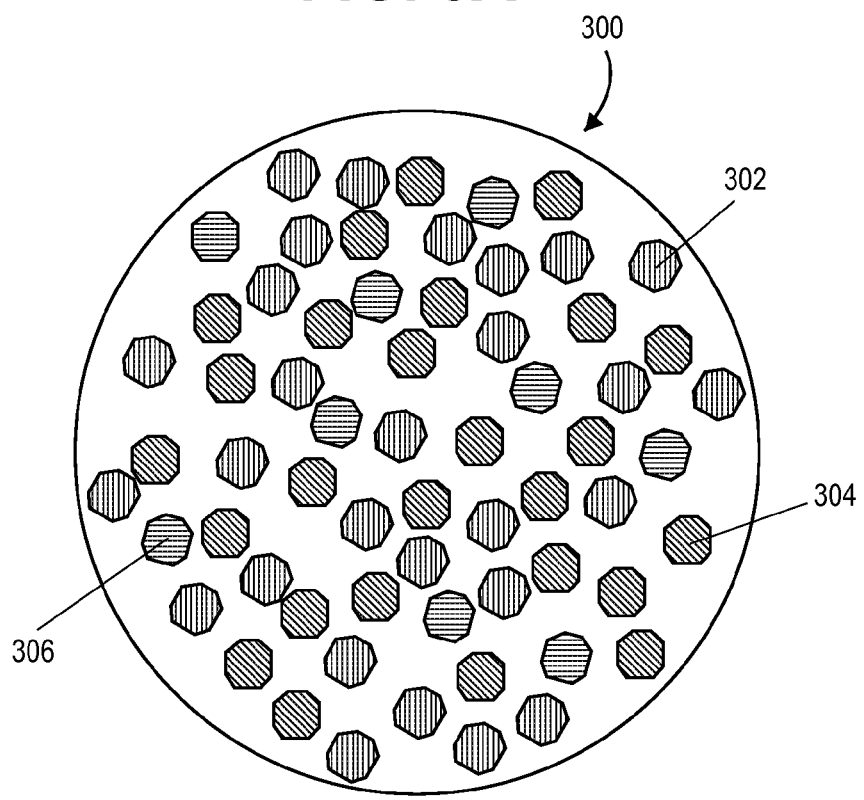
Figure 4:
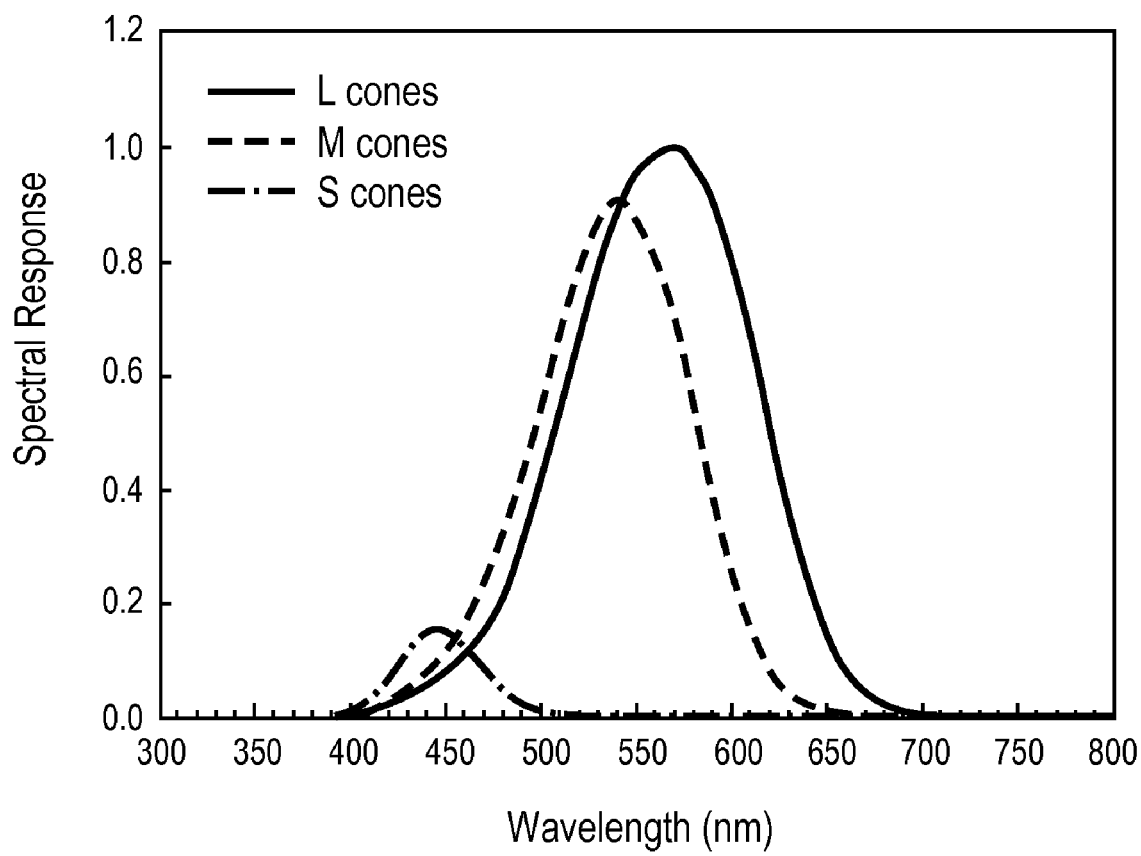
FIG. 4 depicts typical spectral responses of human eye retina.
Figure 5A:
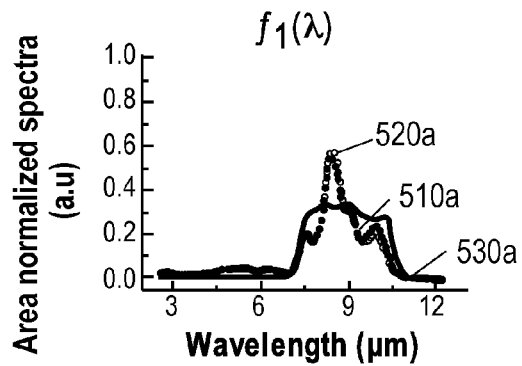
FIGS. 5A-5D depict experimentally reconstructed spectra from the IR retina of FIGS. 1-2 with the actual spectra of target in accordance with the present teachings.
Figure 5B:
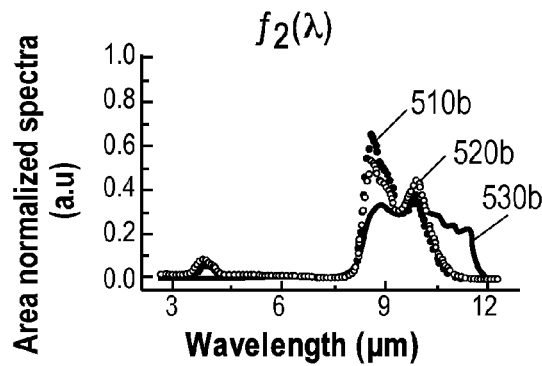
Figure 5C:
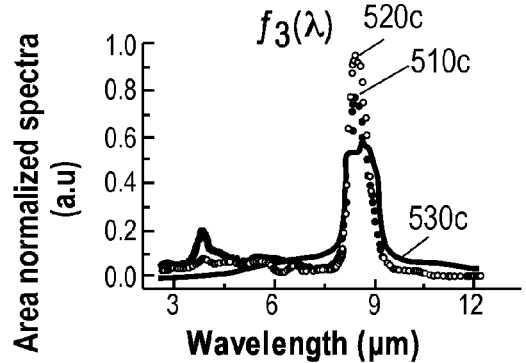
Figure 5D:
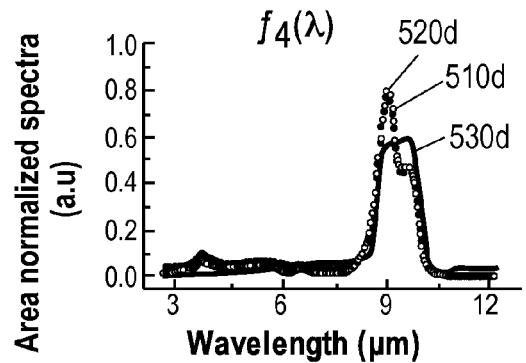

For comparison purpose, FIGS. 3A-3B depict the working mechanism of human eye retina with respect to the disclosed IR retinal system shown in FIGS. 1-2. As shown in FIGS. 3A-3B, the human eye can focus light 310 onto the retina 300, which is populated by three classes of spectrally sensitive receptors 302, 304 and 306 as shown in FIG. 3B. The optical field can then be sampled spatially and spectrally by the corn mosaic. FIG. 4 shows typical spectral responses of the human eye retina 300 of FIG. 3A.

The disclosed IR retinal systems can be applied by different bias voltages to neighboring IR pixels/DWELL sensors/detectors 105 and provide different spectral responses (see FIG. 213). Like the cones, these responses can have significant redundancy, necessitating further processing for optical spectral sensing. Comparing results shown in FIG. 2B and FIG. 4, the DWELL responses can bear resemblance to the human eye photoreceptor spectral response functions, suggesting that if properly wired in the way the retina is, that they can provide "infrared color vision".

In various embodiments, when the disclosed IR retinal systems are combined with signal processing strategies, functional information (e.g., the color, intensity, spectral responses, and/or polarization) can be extracted from a given scene that is observed. For example, a projection algorithm-based signal-processing technique can be used in conjunction with multiple measurements taken by the same radiation source while varying the operational setting of the detector, such as changing the D.C. bias of the DWELL detector, the bias-driven diversity in the spectra can be exploited to produce a desired response different from the spectral response of the DWELL detector Such response can be tunable multi-spectral responses that have a tunable center wavelength and a selectable bandwidth.

In this manner, an imaging system can be developed based on such spectrally agile sensors, in some embodiments, utilizing concepts seen in the human retina such as spatial sampling and spectrally redundant channels. The results indicate the disclosed IR spectral sensing can provide greater flexibility and adaptive imaging motivated by functionality of the retina. In an exemplary embodiment, the IR images in a long wave IR at about 8 μm can be obtained at a temperature of about 60K from an exemplary 640×512 DWELL IR camera.

Thus, the DWELL detectors can be used to form a sensor system by making the detector function like an infrared retina, with neighboring pixels having different bias voltages, and with different spectral response functions. Similar strategies can be performed for three-color cameras in the visible spectrum as well as polarization-sensitive imagers using fixed filters or wire grid polarizers.

For example, the scene spectrum can be sampled both spatially and spectrally. That is, neighboring detectors fabricated monolithically can be biased differently so as to obtain spectral diversity that can be used in a super pixel fashion to estimate the spatio-spectral signature at a location in the scene. In addition, it is possible to make the biases applied to the detectors variably, allowing the sensor to function as an adaptive spectral imager. The ultimate performance can be achieved if the individual pixels is independently biased, enabling a sensor that is spatially, spectrally, and temporally adaptive to information in a scene. Such a strategy can balance the processing speed of a massively parallel sensor system with the flexibility afforded by time serial addressing.

Note that the disclosed class of sensor may not be a one-to-one replacement for some traditional spectral imagers. Instead, the disclosed DWELL-based sensors may provide a different class of sensor that performs better for some applications and worse for others. For example, some applications place the most stringent demands on the achromatic channel (thermal broadband), while using spectral differences to augment the image information. This is the way that the eye functions in the visible. For solving these classes of problems, the sensor based on DWELL detectors can have better performance than a traditional spectral sensor in terms of signal-to-noise ratio (SNR) because of the correlation of the band responses. However, for applications where specific, narrow spectral features are desired, traditional HSI systems can be expected to outperform DWELL designs. It is a subject of intense interest to describe the class of spectral imaging problems that are best suited to analysis by this new class of sensor.

In various embodiments, the disclosed DWELL detectors can provide lower responsivity and quantum efficiency as compared to conventional detectors having multi color response in the IR. There can be several primary differences between the disclosed DWELL technology and the other material systems. First, the DWELL detectors can be the only ones that exhibit multicolor response in a single active region. Second, the single active area can allow for a simpler read-out design, as multiple active regions require multiple pairs of electrical contacts. Third, all other technologies have a finite number of spectral responses, whereas the DWELL detectors can have continuously variable, and thus infinite spectral responses that allows for algorithmic spectral tunability. Finally, DWELL devices can have inherent performance advantages over the other detector technologies because the DWELL devices are based on mature GaAs processing (an advantage over traditional HgCdTe) and are inherently sensitive to normally-incident photons (i.e., an advantage over traditional QWIPs).

FIGS. 5A-5D depict reconstructed experimentally spectra (see 510a-d) from the IR retina, theoretically reconstructed spectra (see 520a-d), along with the actual spectra of the target (see 530a-d) in accordance with the present teachings. As shown, the experimental reconstructions of the target spectra can be good approximations of their true spectra.

In this example, the spectra of FIGS. 5A-5D are constructed without using a spectrograph or spectrometer. For the experiments of FIGS. 5A-5D, four different center wavelengths (e.g., $\lambda_0$=9-10 µm) and different spectral bandwidths (e.g., $\Delta\lambda$=1.0-3.5 µm) were considered. The spectral response of the DWELL detector was measured at detector temperature of about 30 K for bias voltages between about −5 V and about 5 V by using a FTIR spectrometer and a globar source. The dark current was also measured for the detectors at these biases for computing the signal-to-noise ratios (SNR). These data were stored in a "library" and included the spectral response and dark current of each "cone". The photocurrents were measured for each target for every applied bias. It is also noted in the experiments that the same detector was sequentially biased, to generate the response of a desired spectral filter. However, an infrared retinal system with different applied bias to each pixel without using read out integrated circuits can be utilized.

In various embodiments, the disclosed DWELL-based detector system can provide bias-dependent responses that come close to a particular scene space for accurate sensing. In addition, a sensor space, that is close to scene space and represents the data in channels with suitably high SNR, can be desired for the disclosed DWELL-based retinal system.

In other embodiments, the disclosed DWELL-based detector system can provide bias-dependent responses that can be linearly combined according to a canonical-correlation spectral-feature selection algorithm to design an optimal machine classifier that discerns among classes of objects to be sensed. In various embodiments, the spatial features can be compounded to the spectral features to improve the performance of a classifier.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An infrared (IR) retinal system comprising:
a plurality of photodetectors arranged as a plurality of photodetector groups and in a single focal plane array (FPA), wherein each photodetector of the plurality of photodetectors comprises a dots-in-a-well (DWELL) active structure and is individually controllable to provide a spectral response without using an optical component selected from the group consisting of a filter and a grating, and wherein each photodetector group of the plurality of photodetector groups is configured to provide a different spectral response, a different spatial response, and a different temporal response.

2. The system of claim 1, wherein the spectral response of each photodetector is individually controlled in an independent or dependent manner from one or more other photodetectors of the single FPA.

3. The system of claim 1, wherein each photodetector comprises a hyper or multicolor spectral response photodetector whose spectral response is controlled individually in an independent or dependent manner from one or more other photodetectors of the single FPA.

4. The system of claim 1, wherein each the photodetector further comprises a property of polarization, phase, or dynamic range that is individually controlled.

5. The system of claim 1, wherein each the photodetector has a tunable center wavelength and a selectable bandwidth, wherein the center wavelength ranges from about 3 µm to about 30 µm and the selectable bandwidth ranges from about 1.0 µm to about 3.5 µm.

6. The system of claim 1, wherein one or more of the spectral response of each photodetector, the different spectral response of each photodetector group, and the different spatial response of each photodetector group are encoded in one or more pixels of the single FPA.

7. The system of claim 1, further comprising one or more read-out systems.

8. The system of claim 1, wherein each photodetector comprises one or more stacks of a heterostructure comprising a plurality of quantum dots assembled in one or more quantum wells for providing a quantum confined Stark effect, and wherein each of the plurality of quantum dots comprises a shape selected from the group consisting of a hemisphere, a triangle and a rectangle.

9. The system of claim 8, wherein the plurality of quantum dots are disposed between two quantum well layers in the heterostructure, wherein the two quantum well layers have different thicknesses, the thickness ranging from about 1 nm to about 10 nm.

10. The system of claim 8, wherein each quantum well comprises an In-containing composition, wherein the element In is about 35% or less by weight of the quantum well In-containing composition.

11. The system of claim 8, wherein the heterostructure comprises one or more materials selected from the group consisting of InGaAs, GaAs, and InAs.

12. The system of claim 1, wherein the DWELL active structure comprises one or more stacks of a heterostructure over a first doped layer; and wherein a second doped layer is disposed over the DWELL active structure.

13. The system of claim 12, wherein each of the first doped layer and the second doped layer comprises an alloy made from GaAs and AlAs and the first doped layer and the second doped layer are doped to have same conductivities.

14. A method for infrared sensing comprising:
forming a plurality of DWELL detectors in a single focal plane array, wherein each DWELL detector comprises one or more stacks of a heterostructure, the heterostructure comprising a plurality of quantum dots assembled in one or more quantum wells for providing a quantum confined Stark effect;

sensing information over different spectrally overlapping wavelength bands due to the quantum confined Stark effect of each DWELL detector;

tailoring a spectral response from each DWELL detector; and extracting a spectral information based on the tailored spectral response using a signal processing algorithm.

15. The method of claim 14, wherein tailoring a spectral response comprises sequentially applying different bias voltages on each of the plurality of DWELL detectors.

16. The method of claim 14, further comprising spatially and spectrally sampling a scene spectrum by differently biasing neighboring DWELL detectors.

17. The method of claim 14, further comprising extracting the spectral information comprising a color, amplitude or polarization state.

18. The method of claim 14, further comprising using one or more processes chosen from a standard contact-lithography, plasma-etching, and a metallization technique to form the plurality of DWELL detectors.

19. The method of claim 14, wherein the plurality of DWELL detectors is formed using a crystal growth technique comprising molecular-beam epitaxy (MBE), metal-organic chemical vapor deposition (MOCVD), gas source MBE (GSMBE), and metal-organic MBE (MOMBE).

20. The method of claim 14, wherein the plurality of DWELL detectors is formed having neighboring detectors monolithically configured.

21. The method of claim 14, further comprising controlling a thickness of the quantum well of the heterostructure to control an operating wavelength of each DWELL detector.

22. An IR retinal system comprising:

a large area focal plane array that comprises a plurality of DWELL detectors configured in a spatial array comprising a plurality of detector groups, wherein each detector group of the plurality of detector groups is configured to provide a different spectral response, a different spatial response, and a different temporal response, and wherein each DWELL detector of the plurality of DWELL detectors is individually controllable to provide a spectral response without using an optical component selected from the group consisting of a filter and a grating, and comprises, a first n-doped layer over a III-V substrate, a DWELL active structure comprising one or more stacks of a heterostructure over the first n-doped layer, the heterostructure comprising a plurality of quantum dots assembled in one or more quantum wells for providing a quantum confined Stark effect; each quantum dot comprising an InAs and each quantum well comprising an In-containing composition having the element In of about 35% or less by weight, and a second n-doped layer disposed over the DWELL active structure; wherein the first and the second doped layers comprise an alloy made from GaAs and AlAs.

\* \* \* \* \*